United States Patent
Schwarzenbacher et al.

(10) Patent No.: US 9,779,979 B2
(45) Date of Patent: Oct. 3, 2017

(54) APPARATUS FOR LIQUID TREATMENT OF WAFER SHAPED ARTICLES

(71) Applicant: LAM RESEARCH AG, Villach (AT)

(72) Inventors: Reinhold Schwarzenbacher, Reisseck (AT); Milan Pliska, Villach (AT)

(73) Assignee: LAM RESEARCH AG, Villach (AT)

( * ) Notice: Subject to any disclaimer, the term of this patent is extended or adjusted under 35 U.S.C. 154(b) by 575 days.

(21) Appl. No.: 14/188,230

(22) Filed: Feb. 24, 2014

(65) Prior Publication Data

US 2015/0243543 A1 Aug. 27, 2015

(51) Int. Cl.
*H01L 21/687* (2006.01)
*H01L 21/67* (2006.01)

(52) U.S. Cl.
CPC .. *H01L 21/68785* (2013.01); *H01L 21/67051* (2013.01); *H01L 21/68742* (2013.01); *Y10T 137/7306* (2015.04); *Y10T 279/17* (2015.01); *Y10T 279/34* (2015.01)

(58) Field of Classification Search
CPC ......... H01L 21/67051; H01L 21/68742; H01L 21/68785; Y10T 279/17; Y10T 279/34; Y10T 137/7306
USPC ....................................................... 137/392
See application file for complete search history.

(56) References Cited

U.S. PATENT DOCUMENTS

| | | | |
|---|---|---|---|
| 4,903,717 A | 2/1990 | Sumnitsch | |
| 5,513,668 A | 5/1996 | Sumnitsch | |
| 6,432,727 B1 | 8/2002 | Sonoda | |
| 6,435,200 B1 | 8/2002 | Langen | |
| 6,536,454 B2 | 3/2003 | Lindner | |
| 7,335,090 B2 | 2/2008 | Takahashi | |
| 7,837,803 B2 | 11/2010 | Hohenwarter | |
| 2008/0070418 A1* | 3/2008 | Miyagi | H01L 21/67051 438/745 |
| 2011/0254236 A1 | 10/2011 | Brugger et al. | |

OTHER PUBLICATIONS

Commonly-owned co-pending U.S. Appl. No. 13/849,072, inventors Reinhold Schwarzenbacher et al.

* cited by examiner

*Primary Examiner* — Sunil K Singh
*Assistant Examiner* — Paul M Janeski

(57) ABSTRACT

An apparatus for processing wafer-shaped articles comprises a spin chuck adapted to hold and spin a wafer-shaped article of a predetermined diameter during a processing operation. A liquid collector surrounds the spin chuck, and comprises a first inner surface. The first inner surface comprises a first conductive material. The collector further comprises a first conductive pathway for grounding the first conductive material.

25 Claims, 2 Drawing Sheets

APPARATUS FOR LIQUID TREATMENT OF WAFER SHAPED ARTICLES

BACKGROUND OF THE INVENTION

1. Field of the Invention

The invention relates to an apparatus for liquid treatment of wafer-shaped articles.

2. Description of Related Art

Semiconductor wafers undergo a variety of wet processing stages during manufacture of integrated circuits. To accommodate such processes, a single wafer may be supported in relation to one or more treatment fluid nozzles by a chuck associated with a rotatable or non-rotatable carrier. Wafer-supporting chucks are described for example in U.S. Pat. Nos. 4,903,717, 5,513,668, 6,435,200 and 6,536,454.

It is known that semiconductor wafer processing can result in unwanted buildup of static charge on the wafer surface. For example, U.S. Pat. No. 7,335,090 describes a spin chuck having holding pins which are formed of conductive resin and associated with a stainless steel shaft, which in turn is supported by radial metal bearings. Commonly-owned co-pending application U.S. Pub. No. 2011/0254236 describes a chuck with conductive chuck pins as well as a conductive path to connect the chuck pins with the shaft of the chuck drive and elevating unit.

While providing a conductive path in contact with the wafer edge via the griping pins was assumed to solve the problem of unwanted wafer charging, the present inventors have discovered unexpectedly that charging of a wafer may occur even in the absence of physical contact between the wafer and the chuck, as may occur at various stages during wafer processing. Furthermore, the present inventors have discovered unexpectedly that undesired charging of a wafer may occur even between the wafer and static structures adjacent the chuck but separate from the chuck itself.

SUMMARY OF THE INVENTION

Thus, in one aspect, the present invention relates to an apparatus for processing wafer-shaped articles, comprising a spin chuck adapted to hold and spin a wafer-shaped article of a predetermined diameter during a processing operation to be performed on the wafer-shaped article, and a liquid collector surrounding the spin chuck. The liquid collector comprises a first inner surface, wherein the first inner surface comprises a first conductive material and wherein the collector further comprises a first conductive pathway for grounding the first conductive material.

In preferred embodiments of the apparatus according to the present invention, the liquid collector comprises at least two levels and wherein the spin chuck is movable vertically relative to the liquid collector so as to position a wafer mounted on the spin chuck at a selected one of the at least two levels.

In preferred embodiments of the apparatus according to the present invention, surfaces of the liquid collector facing the spin chuck, other than the first inner surface, are made of a non-conductive plastic.

In preferred embodiments of the apparatus according to the present invention, the non-conductive plastic comprises one or more members selected from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

In preferred embodiments of the apparatus according to the present invention, the non-conductive plastic comprises PCTFE.

In preferred embodiments of the apparatus according to the present invention, the liquid collector comprises an inwardly-directed baffle, and wherein the first conductive material is inlaid in the inwardly-directed baffle.

In preferred embodiments of the apparatus according to the present invention, the liquid collector comprises an inwardly-directed baffle at an uppermost one of the at least two levels, and wherein the first conductive material is inlaid in the inwardly-directed baffle.

In preferred embodiments of the apparatus according to the present invention, the first conductive material is a conductive polymer.

In preferred embodiments of the apparatus according to the present invention, the first conductive material is stainless steel.

In preferred embodiments of the apparatus according to the present invention, the first conductive material comprises a plurality of conductive elements arranged circumferentially in the first inner surface of the liquid collector.

In preferred embodiments of the apparatus according to the present invention, the spin chuck comprises a plurality of pin assemblies adapted and positioned so as to support a wafer-shaped article to be processed, wherein at least one of the pin assemblies is formed from a chemically inert material and includes an electrically conductive inlay at one end, the inlay being adapted to physically and electrically engage a bearing element.

In preferred embodiments of the apparatus according to the present invention, the bearing element is an electrically conductive needle bearing.

In another aspect, the present invention relates to a liquid collector for use in an apparatus for processing wafer-shaped articles, the liquid collector being configured to surround a spin chuck adapted to hold and spin a wafer-shaped article of a predetermined diameter during a processing operation to be performed on the wafer-shaped article. The liquid collector comprises a first inner surface, wherein the first inner surface comprises a first conductive material and wherein the collector further comprises a first conductive pathway for grounding the first conductive material.

In preferred embodiments of the liquid collector according to the present invention, an internal structure defines at least two process levels at which a spin chuck may be positioned by relative vertical movement between the liquid collector and a spin chuck.

In preferred embodiments of the liquid collector according to the present invention, inwardly-facing surfaces of the liquid collector, other than the first inner surface, are made of a non-conductive plastic.

In preferred embodiments of the liquid collector according to the present invention, the non-conductive plastic comprises one or more members selected from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

In preferred embodiments of the liquid collector according to the present invention, the non-conductive plastic comprises PCTFE.

In preferred embodiments of the liquid collector according to the present invention, the collector further comprises an inwardly-directed baffle, and the first conductive material is inlaid in the inwardly-directed baffle.

In preferred embodiments of the liquid collector according to the present invention, the collector further comprises an inwardly-directed baffle at an uppermost one of the at least two levels, and wherein the first conductive material is inlaid in the inwardly-directed baffle.

In preferred embodiments of the liquid collector according to the present invention, the first conductive material is a conductive polymer.

In preferred embodiments of the liquid collector according to the present invention, the first conductive material is stainless steel.

In preferred embodiments of the liquid collector according to the present invention, the first conductive material comprises a plurality of conductive elements arranged circumferentially in the first inner surface.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
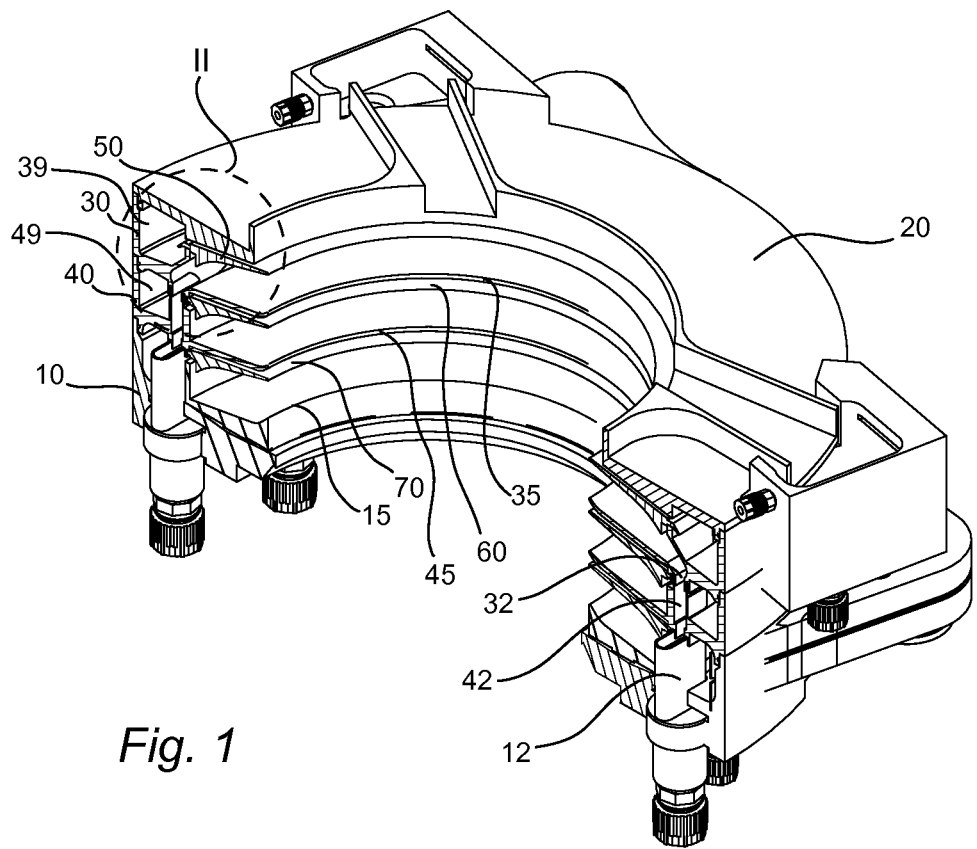
FIG. 1 is a perspective view of a liquid collector in axial cross-section, according to a first embodiment of the present invention.

In FIG. 1 a liquid collector comprises four principal components, namely, the base component 10, top component 20, first intermediate component 30 and second intermediate component 40. The half of the liquid collector not visible in FIG. 1 is generally a mirror image of that shown.

In this embodiment, the liquid collector is an assembly of detachable modular components, as described more fully in commonly-owned co-pending U.S. patent application Ser. No. 13/849,072. However, in the context of the present embodiment, the various components need not be detachable from one another, and any two or more of these components may also be formed integrally if desired.

The collector assembly of FIG. 1 also includes upper deflector 50, middle deflector 60 and lower deflector 70, whose structure and function will be described hereinbelow.

Figure 4:
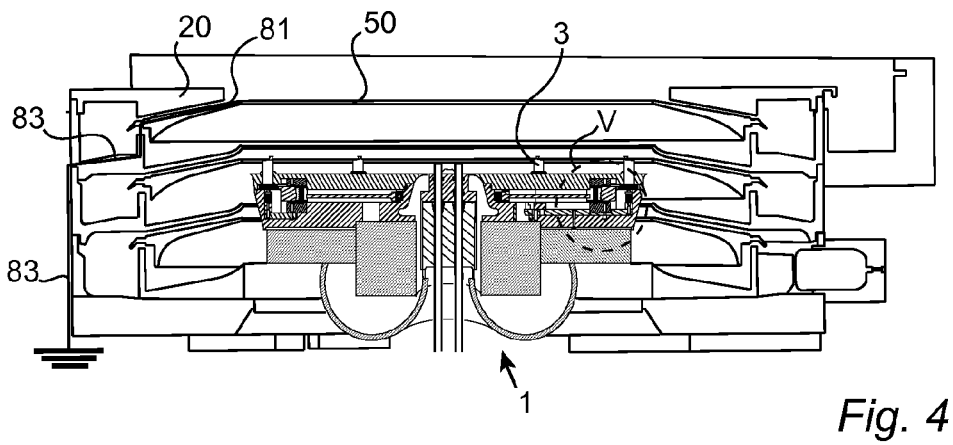
FIG. 4 is an axial cross-section through an apparatus according to a first embodiment of the present invention.

As is known to those skilled in the art, the collector assembly of FIG. 1 in use surrounds a spin chuck, such as those utilized for single wafer wet processing of semiconductor wafers, as shown in present FIG. 4 and as described for example in U.S. Pat. Nos. 4,903,717 and 7,837,803. Such spin chucks are designed to hold wafers of a predetermined diameter, with 300 mm and 450 mm being diameters currently in use and under present development. The spin chuck is movable relative to the collector between each of three collector levels, as well as an uppermost loading and unloading position. The relative movement between collector assembly and spin chuck may be achieved either by raising and lowering the spin chuck relative to a stationary collector assembly, or by raising and lowering the collector assembly relative to a stationary spin chuck, or by simultaneously raising or lowering both the spin chuck and the collector assembly in opposite directions or at differing speeds in the same direction.

Therefore, a lowermost process level corresponds to the position in which a spin chuck has its upper surface approximately flush with the radially inner upper edge 15 of the base component 10. The sloping surface that begins at that edge serves to collect liquid flung off of the surface of a wafer, and direct it to a drain in the base component.

The deflector 70 will also direct liquid downwardly and outwardly toward the drain in base component 10, and moreover defines a gap between itself and the lower facing surface of the second intermediate component 40, through which exhaust gas may be pulled into the outer exhaust ducts of the collector assembly.

A middle process level corresponds to the position in which a spin chuck has its upper surface approximately flush with the radially inner edge 45 of the second intermediate component 40. The sloping surface that begins at that edge likewise serves to collect liquid flung off of the surface of a wafer, and direct it to a drain in the second intermediate component 40.

In this case the middle deflector 60 will also direct liquid downwardly and outwardly toward the drain in the second intermediate component 40, and moreover defines a gap between itself and the lower facing surface of the first intermediate component 30, through which exhaust gas may be pulled into the outer exhaust ducts of the collector assembly.

Similarly, an upper process level corresponds to the position in which a spin chuck has its upper surface approximately flush with the radially inner edge 35 of the first intermediate component 30. The sloping surface that begins at that edge likewise serves to collect liquid flung off of the surface of a wafer, and direct it to a drain 32 in the first intermediate component 30.

In this case the upper deflector 50 will also direct liquid downwardly and outwardly toward the drain in the first intermediate component 30, and moreover defines a gap between itself and the lower facing surface of the top component 20, through which exhaust gas may be pulled into the outer exhaust ducts of the collector assembly.

The various components of the collector assembly, and especially those which are contacted by the often aggressive chemicals utilized during processing of semiconductor wafers, are preferably formed from a chemically inert material such as plastics comprising one or more members selected from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

Such materials are also non-conductive, in the absence of the incorporation of additional materials to render them conductive. However, the inventors discovered that when a non-conductive liquid (e.g. de-ionized water and solvents such as isopropanol) is poured onto a spinning wafer for rinsing purpose, not only is the wafer electrically charged but also the inwardly facing collector elements such as the deflectors are electrically charged to a significant extent.

In particular, the present inventors determined that the charging between a wafer and the surrounding collector elements can be as much as 5000 V. Therefore, electrical discharge can occur even if the wafer is grounded via the chuck, for example as described in commonly-owned co-pending application U.S. Pub. No. 2011/0254236.

The charging of the wafer surface by electrostatic induction from the surrounding liquid collector structure was unexpected because those skilled in this art considered that electrostatic induction (separation of charges) occurred based on friction between two non-conductive materials. Friction between two non-conductive materials however would require the two materials to contact one another. As the liquid collector does not contact the wafer and thus creates no friction between itself and the wafer, it was surprising to discover that the collector could nonetheless charge the wafer surface by electrostatic induction, and indeed lead in some cases to a very high surface charge on the wafer.

Electrostatic charging of a semiconductor wafer is a problem of increasing concern, as each successive technology node is accompanied by an ever-stricter requirement for the maximum allowable electrostatic charge that can accumulate not only on the devices and structures formed on the wafer itself, but also on surfaces of the processing equipment. For example, for the 18 nm technology node scheduled for 2018, the maximum allowable electrostatic charge on the semiconductor devices formed on the wafers is specified at 0.08 nC, which corresponds to about 8 V/cm, a very low level of static charge.

Conventionally, electrostatic charge on semiconductor wafers is mitigated using an ionization bar technique located above the process chamber, for example as described in U.S. Pat. No. 6,432,727. However, that technique is quite costly from the standpoint of both capital outlay and maintenance costs.

Figure 2:
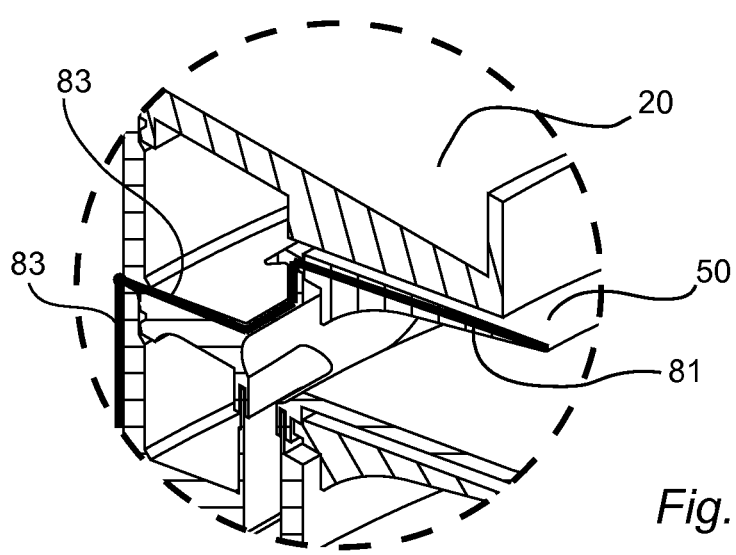
FIG. 2 is an enlarged view of the detail II designated in FIG. 1.
Figure 3:
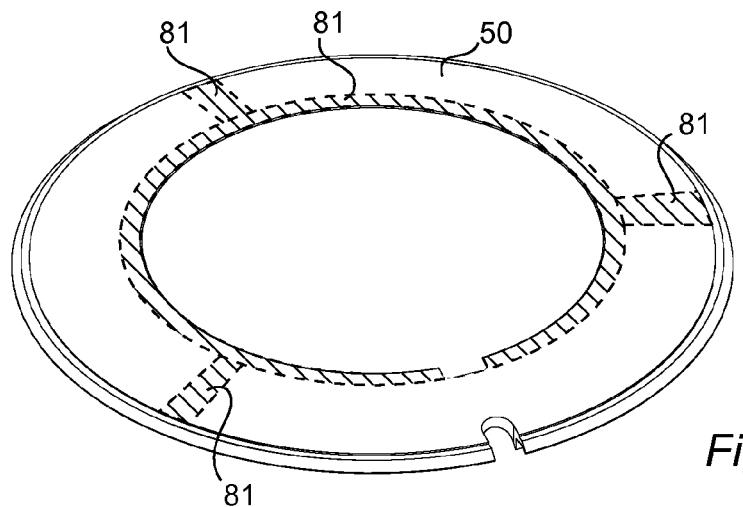
FIG. 3 is a perspective view of the upper deflector 50 of the liquid collector shown in FIG. 1.

In the present embodiment, the upper deflector 50 is equipped with conductive elements 81, as shown in FIGS. 2-4. The conductive elements 81 may for example take the form of a plurality of circumferentially arranged conductive elements or a conductive ring, or both, as shown in FIG. 3.

The conductive element(s) 81 may be fitted into a corresponding groove formed in deflector 50, so that the upper surfaces thereof are exposed and flush with the upper surface of deflector 50. Alternatively, the conductive element(s) 81 may be positioned internally of the deflector 50, with only an inner edge portion thereof exposed, or with no portion thereof exposed if the thickness of the covering material of deflector 50 is sufficiently low.

The conductive element is preferably made of a conductive polymer, but can also be made of stainless metal, such as stainless steel.

As shown in FIG. 4, the conductive elements 81 are electrically connected to ground (for example, the machine frame), via a conductive pathway formed of one or more conductive elements 83.

Also shown in FIG. 4 is a spin chuck 1 that holds a wafer thereon in a predetermined orientation, which is preferably such that the major surfaces of the wafer are disposed horizontally or within ±20° of horizontal. Spin chuck 1 may for example be a chuck that operates according to the Bernoulli principle, as described for example in U.S. Pat. No. 4,903,717.

Chuck 1 includes a series of gripping pins 3, which in this embodiment are six in number, although only four are visible in FIG. 4. Gripping pins 3 prevent the wafer from sliding laterally off the chuck. In this embodiment, the upper portions of gripping pins 3 also provide subjacent support for wafer W, and thus the chuck need not operate according to the Bernoulli principle and need not be adapted to supply a gas cushion beneath wafer. In particular, and as is described more fully in commonly-owned co-pending application U.S. Pub. No. 2011/0254236, each gripping pin 3 comprises an uppermost gripping portion that extends vertically from the cylindrical pin base, generally along an axis that is offset in relation to the rotation axis of the cylindrical pin base. The upper gripping portions furthermore each comprise a lateral recess or cut-out that is designed to accommodate the peripheral edge of a wafer, as is described in greater detail below.

Figure 5:
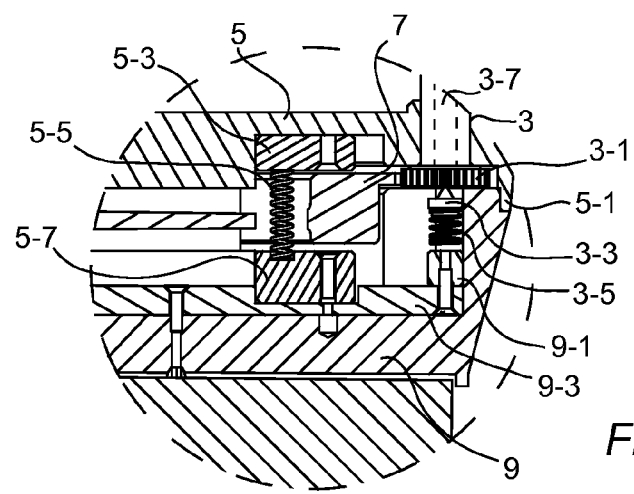
FIG. 5 is an enlarged view of the detail V designated in FIG. 4.

As shown in FIG. 5, gripping pins 3 project upwardly through holes formed in a chuck cover 5, which is mounted to the base body 9 of the chuck 1.

Gripping pins 3 are conjointly rotated about their cylindrical axes by a ring gear 7 that rotates coaxially with chuck 1 and is simultaneously in meshing engaging with all of the gripping pins 3. The eccentric grippers are thus moved in concert between a radially inner closed position in which a wafer is secured, to a radially outer open position in which the wafer is released. Gripping pins 3 comprise an eccentric uppermost portion that contacts wafer, projecting from a base that is mounted for pivotal movement about its central axis. In particular, the ring gear 7 is centered on the underside of the chuck upper body 9, and simultaneously engages via its peripheral gear teeth with gear teeth formed on the base of each of the pins 3. Pins 3 are evenly distributed about the periphery of spin chuck 1, with at least three and preferably six such pins 3 being provided.

A given chuck 1 is designed for holding a wafer of a particular diameter. The gripping surfaces of pins 3, when in their radially inner closed position, thus describe a circle of that diameter. Chucks for wafers currently in commercial production are designed to hold wafers of 200 mm or 300 mm, while wafers of 450 mm will be the next generation.

As shown in FIG. 5, the cover 5 of chuck 1 is seated via an annular rib 5-1 at its outer periphery on the outer rim of the chuck base body 9 such that an internal gap is provided between an upper surface of the base body 9 and a lower surface of the cover 5.

The internal gap in this embodiment accommodates the ring gear 7 and additional components to be described in greater detail below. In the case where the chuck is embodied as a Bernoulli chuck, this internal gap can in additional serve as a gas distribution chamber feeding an array of openings provided in the cover 5, as is described in commonly-owned co-pending application U.S. Pub. No. 2011/0254236.

As shown in FIG. 5, each pin assembly 3 includes a shaft extending from a gear wheel 3-1 constituting a base of the pin assembly 3, which shaft is received rotatably in bores in the cover 5 and which carries a gripping pin as described above arranged eccentrically to the axis of rotation of the shaft. Each pin assembly 3 is urged upwardly toward cover 5 by a needle bearing 3-3 and associated helical spring 3-5, each of which is located within a recess formed within the outer upwardly extending peripheral edge of base body 9.

By turning the shafts of the pin assemblies 3 with the aid of the ring gear 7, the radial distance of the gripping pins from the axis of rotation of the chuck 1 can be varied. Mechanisms for providing relative movement of a ring gear and a chuck body so as to rotate eccentrically located pins are known as described for example in U.S. Pat. Nos. 4,903,717 and 5,513,668.

In accordance with the device described in commonly-owned co-pending application U.S. Pub. No. 2011/0254236, one or more of the pin assemblies 3 is formed from static dissipative or electrically conductive material, such as conductive plastic, so as to dissipate static charge through the conductive pin assemblies and along the conductive path established within the chuck. Alternatively, a conductive inlay 3-7 of stainless steel or the like is fitted within a blind bore in the main shaft of the pin assembly 3, and is exposed at the bottom of the pin assembly where it contacts the electrically conductive needle bearing 3-3.

The electrical discharge path continues through the metallic spring 3-5 to the electrically conductive plates 9-1 and 9-3 affixed to the base body 9, and ultimately to ground.

The cover 5 of the chuck body, being conventionally formed of an insulating material, can also cause a static charge buildup on the wafer despite that the cover and the wafer do not come into contact and despite the provision in this embodiment of a conductive path from the wafer to and through the gripping pins. Therefore, the cover 5 in this embodiment is made so as to include an electrically conductive material that faces the wafer, and an electrically conductive pathway is provided leading from the electrically conductive material toward ground.

Thus, referring again to FIG. 5, another electrically conductive pathway is provided extending from the chuck cover 5 (or a portion of that cover made of electrically conductive material) to the upper spring seat 5-3 mounted to an underside surface of cover 5, and continuing via the helical spring 5-5 and the lower spring seat 5-7 mounted to the conductive strip 9-3, from whence this pathway is the same as described above for the preceding pathway. In FIG. 5 it will moreover be noted that the spring(s) 5-5 each pass through a respective opening formed in ring gear 7. Needless to say, each of the foregoing components involved in the first and second conductive pathways is itself electrically conductive either in whole or in part sufficient to establish the pathway in question.

The upper and lower spring seats 5-3 and 5-7 may if desired take the form of rings or plural segments of rings for example positioned coaxially with the rotation axis of the chuck, so as to accommodate a plurality of springs 5-5.

Thus, chuck 1 optionally provides at least one additional electrically conductive pathway, through the spring seat 5-3, spring 5-5, spring seat 5-7 and conductive strip 9-3, as well as optionally from one or more of the pin assemblies 3 through needle bearing 3-3, helical spring 3-5, spring seat 9-1 and conductive strip 9-3. Each of the above pathways may then be led for example to the chuck rotor, and then onward to an electrical ground, for example, by electrical connection to associated tool framing or another suitable ground.

It will be appreciated that any relatively conductive plastic material having sufficiently electrically conductive properties may be used to form the foregoing electrical pathways, in addition to or instead of metallic elements. For example, suitable conductive plastic materials include polyvinylidene fluoride incorporating conductive carbon, such as that which is marketed under the trade name SIMONA PVDF-EL, and which is reported to exhibit volume and surface resistivities of ≤$10^6$ ohm*cm and ≤$10^6$ ohm, respectively, under test method DIN IEC 60093. Other relatively conductive plastics include carbon filled ethylene tetrafluoroethylene such as, for example, that marketed under the trade name Fluon LM-ETFE AH-3000, and carbon fiber filled perfluoroalkoxy such as, for example, that marketed by Dupont under the trade name VESPEL CR-6110, which comprises a composite of carbon fiber sheets and polymer layers and is believed to exhibit volume and surface resistivities of about $10^{-1}$ ohm*cm and $10^{-1}$ ohm, respectively, in the direction of the layers and about $10^0$ ohm*cm and $10^1$ ohm, respectively, normal to the layers.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. An apparatus for processing a wafer of a predetermined diameter, the apparatus comprising:
a spin chuck adapted to hold and spin the wafer during a processing operation to be performed on the wafer; and
a liquid collector surrounding the spin chuck,
wherein
the liquid collector comprises
a deflector comprising an inner conductive ring and a plurality of conductive elements extending radially from the inner conductive ring to an outer peripheral edge of the deflector, and
a first conductive element connected to the plurality of conductive elements and configured to ground the inner conductive ring,
the plurality of conductive elements do not include the first conductive element, and
the liquid collector does not contact the wafer.

2. The apparatus according to claim 1, wherein:
the liquid collector comprises at least two levels; and
the spin chuck is movable vertically relative to the liquid collector to position the wafer mounted on the spin chuck at a selected one of the at least two levels.

3. The apparatus according to claim 2, wherein:
the deflector is an inwardly-directed baffle at an uppermost one of the at least two levels; and
the inner conductive ring and the plurality of conductive elements are inlaid in the inwardly-directed baffle.

4. The apparatus according to claim 1, wherein components of the liquid collector facing the spin chuck are made of a non-conductive plastic.

5. The apparatus according to claim 4, wherein the non-conductive plastic comprises one or more materials selected from a group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

6. The apparatus according to claim 5, wherein the non-conductive plastic comprises PCTFE.

7. The apparatus according to claim 1, wherein:
the deflector is an inwardly-directed baffle; and
the inner conductive ring and the plurality of conductive elements are inlaid in the inwardly-directed baffle.

8. The apparatus according to claim 1, wherein:
the inner conductive ring and the plurality of conductive elements comprises a first conductive material; and
the first conductive material is a conductive polymer.

9. The apparatus according to claim 1, wherein:
the inner conductive ring and the plurality of conductive elements comprises a first conductive material; and
the first conductive material is stainless steel.

10. The apparatus of claim 1, wherein the inner conductive ring extends along an inner peripheral edge of the deflector.

11. The apparatus according to claim 1, wherein the plurality of conductive elements are disposed in respective radially extending grooves of the deflector.

12. The apparatus according to claim 1, wherein a top surface of the inner conductive ring is exposed and flush with a top surface of the deflector.

13. The apparatus according to claim 1, wherein top surfaces of the plurality of conductive elements are exposed and flush with a top surface of the deflector.

14. The apparatus according to claim 1, wherein:
the liquid collector comprises a first exhaust duct and a second exhaust duct; and
the first conductive element extends between the first exhaust duct and the second exhaust duct and around an outer periphery of the second exhaust duct.

15. A liquid collector for use in an apparatus for processing a wafer of a predetermined diameter, the liquid collector comprising:
a deflector configured to surround a spin chuck, which is adapted to hold and spin the wafer during a processing operation to be performed on the wafer, wherein the deflector does not contact the wafer during the processing operation, and wherein the deflector comprises an inner conductive ring and a plurality of conductive elements extending radially from the inner conductive ring to an outer peripheral edge of the deflector;
an exhaust duct disposed at a lower level of the liquid collector than the deflector and radially outward from the deflector; and
a first conductive element connected to at least one of the plurality of conductive elements and configured to ground the inner conductive ring, wherein the first conductive element extends around a portion of the exhaust duct, and wherein the plurality of conductive elements do not include the first conductive element.

16. The liquid collector according to claim 15, further comprising internal structure defining at least two process levels at which the spin chuck is configured to be positioned at by vertical movement of the spin chuck relative to the liquid collector.

17. The liquid collector according to claim 16, wherein:
the deflector is an inwardly-directed baffle at an uppermost one of the at least two levels; and
the inner conductive ring and the plurality of conductive elements are inlaid in the inwardly-directed baffle.

18. The liquid collector according to claim 15, wherein inward facing components of the liquid collector are made of a non-conductive plastic.

19. The liquid collector according to claim 18, wherein the non-conductive plastic comprises one or more materials selected from a group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

20. The liquid collector according to claim 19, wherein the non-conductive plastic comprises PCTFE.

21. The liquid collector according to claim 15, wherein:
the deflector is an inwardly-directed baffle; and
the inner conductive ring and the plurality of conductive elements are inlaid in the inwardly-directed baffle.

22. The liquid collector according to claim 15, wherein:
the inner conductive ring and the plurality of conductive elements comprise a first conductive material; and
the first conductive material is a conductive polymer.

23. The liquid collector according to claim 15, wherein:
the inner conductive ring and the plurality of conductive elements comprise a first conductive material; and
the first conductive material is stainless steel.

24. An apparatus for processing a wafer, the apparatus comprising:
a spin chuck adapted to hold and spin the wafer during a processing operation to be performed on the wafer; and
a liquid collector surrounding the spin chuck and comprising a deflector and a first conductive element, wherein the deflector comprises a second conductive element in contact with the first conductive element, wherein
the first conductive element is separate from the deflector and grounds the second conductive element,
the spin chuck comprises a plurality of pin assemblies adapted and positioned to support the wafer,
one of the plurality of pin assemblies comprises a gripping pin,
at least one of the pin assemblies is formed from a chemically inert material and includes an electrically conductive inlay at one end,
the inlay is adapted to physically and electrically engage a bearing element,
the spin chuck comprises a first discharge path and a second discharge path,
the first discharge path comprises the inlay, the gripping pin, the bearing element, a first spring, and a plurality of conductive plates, and
the second discharge path comprises a cover, a plurality of spring seats, a second spring, and one of the plurality of conductive plates.

25. The apparatus according to claim 24, wherein the bearing element is an electrically conductive needle bearing.

* * * * *